United States Patent [19]
Hirabayashi

[11] Patent Number: 5,889,314
[45] Date of Patent: Mar. 30, 1999

[54] MIXED-MODE IC HAVING AN ISOLATOR FOR MINIMIZING CROSS-TALK THROUGH SUBSTRATE AND METHOD OF FABRICATING SAME

[75] Inventor: Hiroshi Hirabayashi, Tokyo, Japan

[73] Assignee: NEC Corporation, Tokyo, Japan

[21] Appl. No.: 868,259

[22] Filed: Jun. 3, 1997

[30] Foreign Application Priority Data

Jun. 3, 1996 [JP] Japan .................................. 8-140554

[51] Int. Cl.⁶ .................................................. H01L 27/12
[52] U.S. Cl. ......................... 257/508; 257/501; 438/430
[58] Field of Search ................................... 257/508, 520, 257/500, 501, 502; 438/430, 429

[56] References Cited

U.S. PATENT DOCUMENTS

| 4,819,052 | 4/1989 | Hutter | 257/520 |
| 4,980,747 | 12/1990 | Hutter et al. | 257/520 |
| 5,065,216 | 11/1991 | Suzuki et al. | 257/520 |
| 5,331,198 | 7/1994 | Kanda et al. | 257/520 |
| 5,442,223 | 8/1995 | Fujii | 257/508 |
| 5,552,626 | 9/1996 | Morikawa | 257/508 |
| 5,675,173 | 10/1997 | Kawai et al. | 257/508 |

FOREIGN PATENT DOCUMENTS

| 61-248464 | 11/1986 | Japan . |
| A 2-271567 | 11/1990 | Japan . |
| 3-46335 | 2/1991 | Japan . |
| 4-147668 | 5/1992 | Japan . |

OTHER PUBLICATIONS

Kuntal Joardar, "A Simple Approach to Modeling Cross–Talk in Integrated Circuits", *IEEE Journal of Solid-State Circuits*, vol. 29, No. 10, Oct. 1994, pp. 1212–1219.

*Primary Examiner*—David B. Hardy
*Attorney, Agent, or Firm*—Sughrue, Mion, Zinn, Macpeak & Seas, PLLC

[57] ABSTRACT

A cross-talk source isolator is provided in an integrated circuit which has an impurity diffused substrate of low resistance on which a silicon region is developed. A digital and analog circuits are formed on the silicon region. A trench is formed in the silicon region, in a direction substantially normal to a major surface of the substrate, in a manner to separate said digital and analog circuits. The trench has a bottom portion reaching the substrate and having an inner wall covered with a dielectric material. The trench includes therewithin an electrically conductive member which has a first end portion electrically connected to the substrate. Further, the electrically conductive member has a second end portion, opposite to the first end portion, coupled to an electrode which leads to a reference voltage source such as ground.

2 Claims, 7 Drawing Sheets

MIXED-MODE IC HAVING AN ISOLATOR FOR MINIMIZING CROSS-TALK THROUGH SUBSTRATE AND METHOD OF FABRICATING SAME

BACKGROUND OF THE INVENTION

1. Field of the Invention

The present invention relates generally to improvements in integrated circuits (ICs) which include digital and analog circuits fabricated on a common substrate, and more specifically to such an IC having a noise isolator provided between the digital and analog circuits to minimize cross-talk through the common substrate. An integrated circuit, which includes digital and analog circuits on the same chip or substrate, is called a mixed-mode IC.

2. Description of the Related Art

As the levels of integration in IC chips go higher, cross-talk between digital and analog circuits formed on a common substrate has become very important. As the digital circuit operates at a higher frequency, more noises are generated from the digital circuit and are undesirably transferred to the analog circuit through the common substrate. That is, the digital circuit functions as a cross-talk source and induces objectionable "substrate potential changes" which adversely affect the operations of the analog circuit. In view of the higher integration in VLSI (very large-scale integration) in recent years, it is highly desirable to provide a cross-talk source isolator between the digital and analog circuits.

Before turning to the present invention it is deemed preferable to briefly describe, with reference to FIGS. 1, 2A–2B, and 3A–3B, known techniques for reducing cross-talk between digital and analog circuits.

FIG. 1 is a schematic top plan view of an IC which includes a digital circuit 2 and an analog circuit 4 both fabricated on a common silicon substrate 6. In order to prevent the cross-talk noises, originated at the digital circuit 2, from being applied to the analog circuit 4 through the substrate 6, a cross-talk source isolator 8 is provided in the substrate 6 in a manner to surround the digital circuit 2. As an alternative, the isolator 8 may be arranged such as to surround the analog circuit 4 in lieu of the digital circuit 2.

FIG. 2A is a sectional view, taken along section line I—I of FIG. 1, showing parts of the digital and analog circuits 2 and 4 in the vicinity of the cross-talk source isolator 8 This isolator 8 surrounds a digital circuit section R1 (viz., digital circuit 2) as shown in FIG. 1. The prior art shown in FIG. 2A is disclosed in Japanese Laid-open Patent Applications Nos. 3-147668 and 3-46335 and features provision of a crosstalk source isolator (corresponding to the isolator 8) which includes a substrate contact region 10 and a metal line 12 coupled to ground. The region 10 contains the same conductive type impurity as a substrate 20 and is electrically conductive. The remaining IC elements and portions are well known in the art and will be referred to later in detail in connection with the present invention, and accordingly, only a list showing the IC elements together with the corresponding reference numerals is given below.

20: p-type silicon substrate containing a high concentration of p-type impurity and thus exhibiting a low electrical resistance;

22: p-well formed in a silicon which is epitaxially grown on the substrate 20;

24: element segregation layer;

26: MOS gate oxide layer;

28: MOS gate polycrystalline silicon;

30: LDD (lightly-doped drain) region;

32: source and drain region;

34: MOS gate side wall;

35: inter-layer insulating film;

36: inter-layer insulating film;

50a, 50b: source electrode; and 50c, 50d: drain electrode.

The cross-talk reduction technique shown in FIG. 2A utilizes the substrate contact 10 and the metal line 12 in combination. As shown in FIG. 2B, it is assumed that two kinds of noises 11a and 11b (FIG. 2B) are generated from the digital circuit section R1. The noise 11a is successfully caught by the diffused region 10 and guided to ground. However, this prior art suffers from the problem that the noise 11b, which reaches the low resistance p-type substrate 20, is transferred to the analog circuit regions R2 by way of the substrate 20. Therefore, the prior art shown in FIG. 2A is unable to prevent the cross-talk noise which propagates deep in the substrate 20.

Another prior art technique is shown in FIG. 3A. As in the first prior art, FIG. 3A is a sectional view, taken along section line I—I of FIG. 1, showing parts of the digital and analog circuits 2 and 4 in the vicinity of the cross-talk source isolator 8. In this case, the isolator 6 comprises a dielectric member 16 provided in a trench 14 surrounding the digital circuit 2 as shown in FIG. 1. The prior art shown in FIG. 3A is disclosed in Japanese Laid-open Patent Application No. 61-248464. The remaining IC elements other than the trench 14 and the dielectric member 16 have been shown in FIG. 2A.

Although the prior art of FIG. 3A is able to prevent the cross-talk noise which does not reach the substrate 20, it can not block the cross-talk noise reaching the substrate 20. Further, when the digital circuit operates at high frequencies, the cross-talk noise (also high frequencies) passes through a parasitic capacitor 18 formed at the dielectric member 16 (FIG. 3B).

For further data of cross-talk, reference should be made to a paper entitled "A Simple Approach to Modeling Cross-talk in Integrated Circuits" by Kuntal Joadar, IEEE Journal of solid-state circuits, vol. 29. No. 10, October 1994, pages 1212–1219.

SUMMARY OF THE INVENTION

It is therefore an object of the present invention to provide a mixed-mode IC having an isolator for minimizing cross-talk through substrate, which is free from the problems inherent in the prior art techniques mentioned above.

In brief, this object is achieved by a cross-talk source isolator which is provided in an integrated circuit which has an impurity diffused substrate of low resistance on which a silicon region is developed. Digital and analog circuits are formed on the silicon region. A trench is formed in the silicon region, in a direction substantially normal to a major surface of the substrate, in a manner to separate said digital and analog circuits. The trench has a bottom portion reaching the substrate and having an inner wall covered with a dielectric material. The trench includes therewithin an electrically conductive member which has a first end portion electrically connected to the substrate. Further, the electrically conductive member has a second end portion, opposite to the first end portion, coupled to an electrode which leads to a reference voltage source such as ground.

One aspect of the present invention resides in an integrated circuit having an impurity diffused substrate of low resistance on which a silicon region is developed, comprising: a digital circuit formed on the silicon region; an analog circuit formed on the silicon region; and a trench formed in the silicon region, in a direction substantially normal to a major surface of the substrate, in a manner to separate said digital and analog circuits, said trench having a bottom portion reaching the substrate and having an inner wall covered with a dielectric material, said trench including therewithin an electrically conductive member which has a first end portion electrically connected to the substrate.

Another aspect of the present invention resides in a method of fabricating a cross-talk source isolator in an integrated circuit, said integrated circuit having an impurity diffused substrate of low resistance on which a silicon region is developed, said integrated circuit including a digital and analog circuits both formed on the silicon region, said method comprising the steps of: forming a trench in the silicon region, in a direction substantially normal to a major surface of the substrate, in a manner to separate said digital and analog circuits, said trench having a bottom portion reaching the substrate; covering an inner wall of said trench with a dielectric material; and forming an electrically conductive member by filling an electrically conductive material within said trench, said conductive member having a first end portion electrically coupled to the substrate.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

An embodiment of the present invention will be described with reference to FIGS. 4A–4F and 5–8. In brief, the present invention resides in provision of an electrical conductor, which is filled in a trench surrounding one of a digital and analog circuit and which electrically connects a low resistance substrate to ground. The inner wall of the trench is covered with a dielectric material. Therefore, the noise generated in the digital circuit is shunted to ground whereby the coupling of cross-talk noise from the digital circuit to the analog circuit is eliminated.

In the following, the IC elements or portions already shown in FIGS. 1, 2A–2B, and 3A–3B are again represented by like numerals for the sake of simplifying the disclosure.

FIGS. 4A–4F are each a section view for showing fabrication processes of an integrated circuit, equipped with a cross-talk source isolator, according to the embodiment.

Figure 4A:
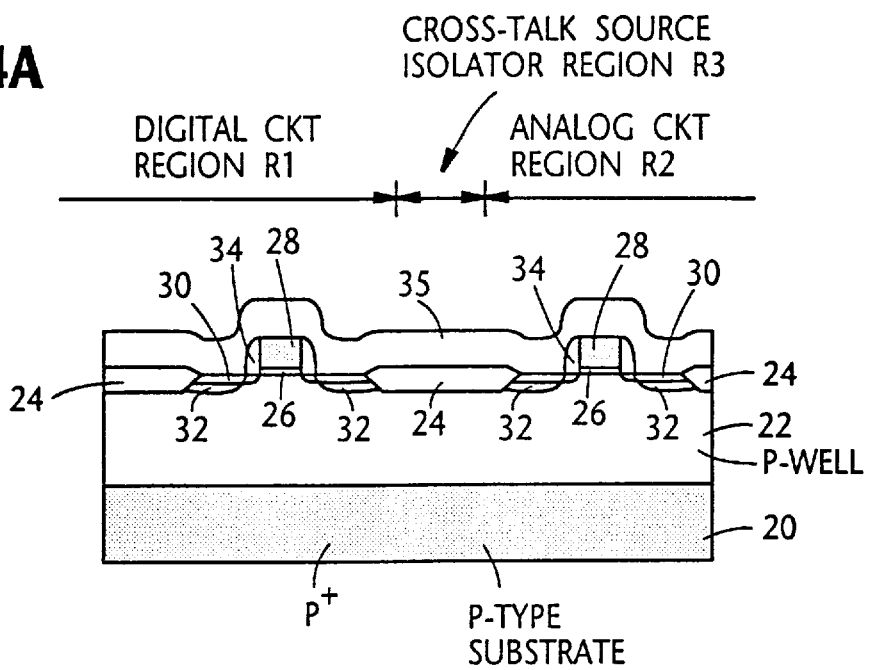
FIGS. 4A–4H are each a sectional view of part of an integrated circuit provided with a cross-talk source isolator embodying the present invention.

Referring to FIG. 4A, a substrate 20 contains a high concentration of p-type impurity to avoid "latchup" that is associated with parasitic bipolar transistors, as is known in the art. Thus, the substrate 20 exhibits a low electrical resistance. Silicon is then grown epitaxially on the p-type substrate 20, after which a p-type impurity is ion implanted into the epitaxially grown silicon so as to form a p-well (or p-tub) 22. This p-well 22 then undergoes heat treatments to activate the implanted p-type impurity. Although not clear in FIG. 4A, a silicon nitride layer with a thickness ranging between 100–200 nm is deposited on the p-well 22. Thereafter, the silicon nitride layer is etched so as to remove the layer except for the portions where transistor elements are to be formed. Following this, a plurality of element segregation layers (SiO$_2$) 24 with a thickness ranging between 400–700 nm are formed in the exposed portions and then selectively removed. Subsequently, as shown in FIG. 4A, onto the p-well 22 are formed MOS gate oxide layers 26, MOS gate polycrystalline silicon 28, LDD (lightly-doped drain) regions 30, source and drain regions 32, MOS gate side walls 34, and.an inter-layer insulating film 35.

Figure 4B:
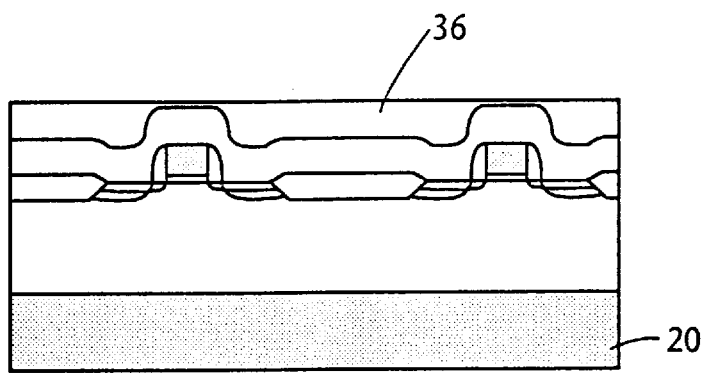

After completing the above mentioned formation of various regions, the entire surface of the structure of FIG. 4A is covered with an inter-layer insulating film 36 in order to make flat the surface (FIG. 4B).

Figure 1:
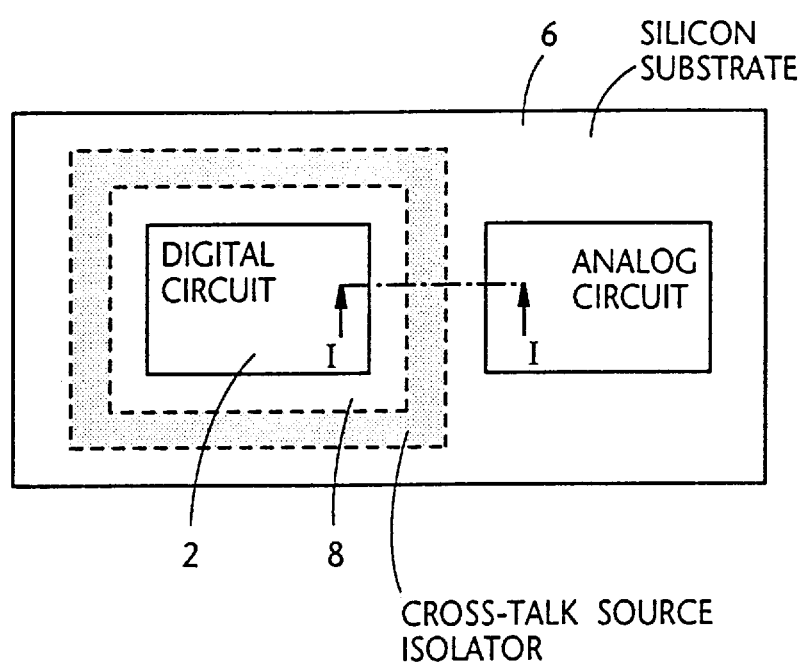
FIG. 1 is a schematic top plan view of a mixed-mode IC which includes a digital and analog circuits fabricated on a common substrate, referred to in the opening paragraphs.
Figure 2A:
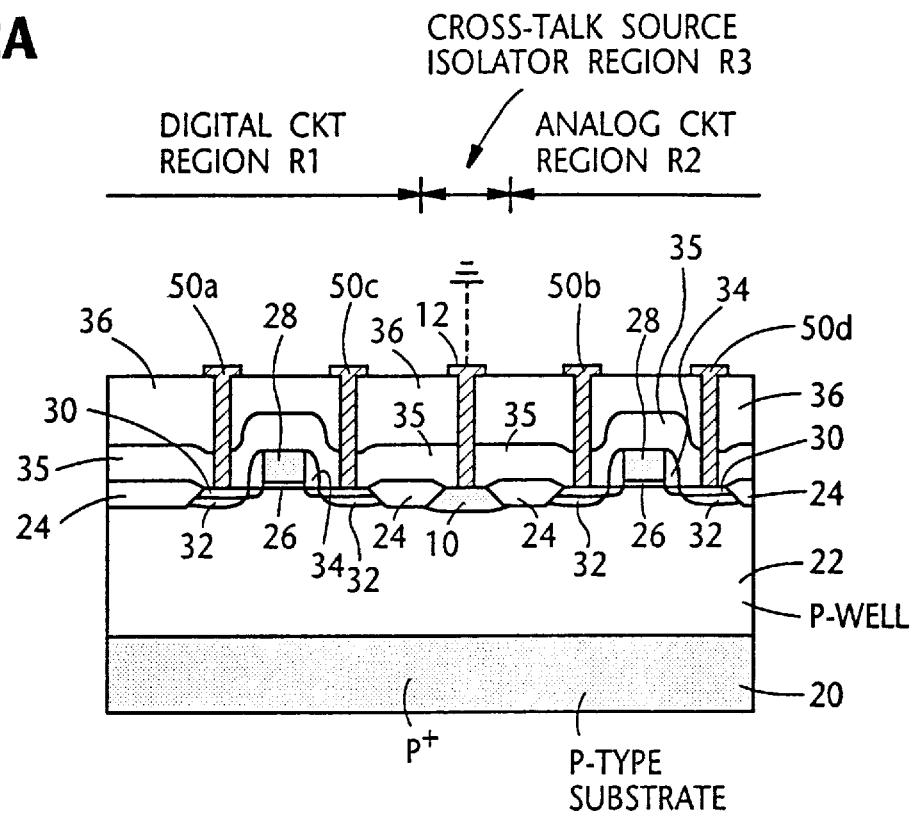
FIGS. 2A–2B are each a sectional view, taken along sectional line I—I of FIG. 1, of a first known technique.
Figure 2B:
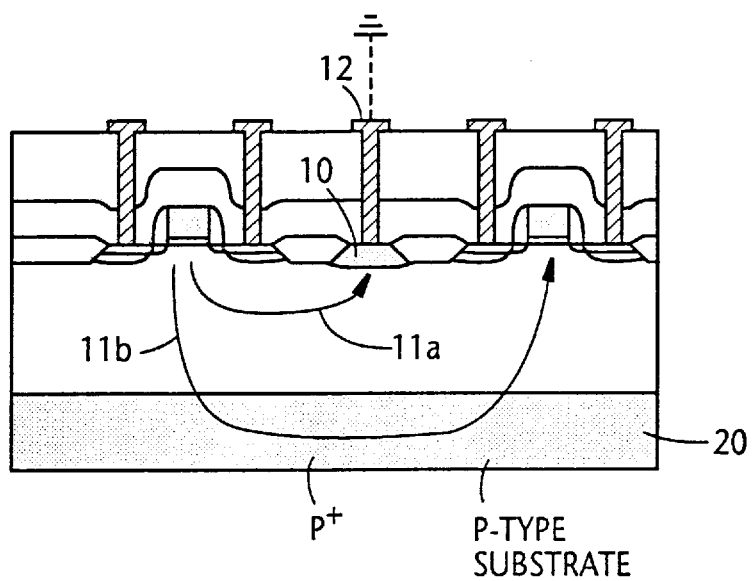
Figure 4C:
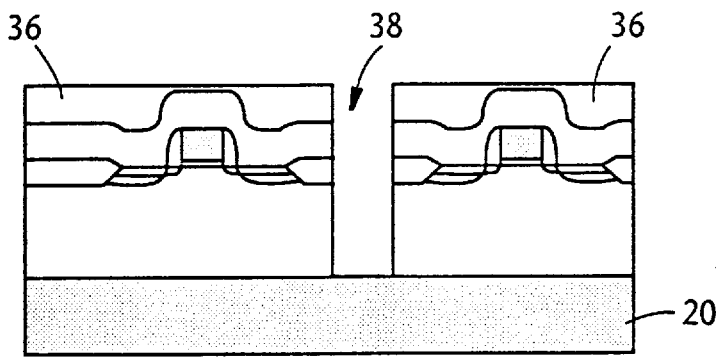
Figure 4D:
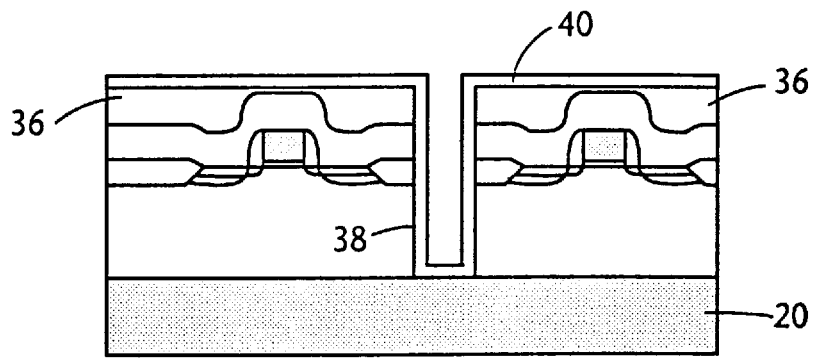
Figure 4E:
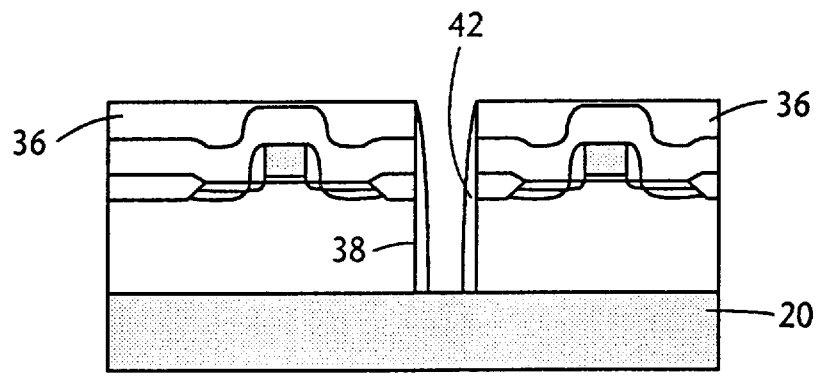

As shown in FIG. 4C, a trench 38 is formed in the cross-talk source isolator region R3 in a manner to reach the top surface of the p-type substrate 20. The trench 38 is arranged such as to surround the digital circuit region R1 as shown in FIG. 1. However, as an alternative, the trench 38 may be formed in a manner to surround the analog circuit region R2 (viz., analog circuit 4 of FIG. 2). Subsequently, as shown in FIG. 4D, an entire surface of the structure of FIG. 4C is covered with a silicon oxide layer 40 with a thickness ranging between 100–300 nm. The silicon oxide layer 40 is then anisotropically etched so as to leave only the oxide layer 42 on the inner side wall of the trench 38 (FIG. 4E). It is to be noted that during the above mentioned anisotropic etching, the silicon oxide deposited on the bottom of the trench is removed as best shown in FIG. 4E.

Following this, a polycrystalline silicon is deposited on the entire surface, including the interior of the trench 38, of the structure shown in FIG. 4E using a chemical vapor deposition (CVD) technique. Thereafter, a p-type dopant is ion implanted into the deposited silicon so as to form a layer with high concentration of p-type impurity. Subsequently, the polycrystalline silicon is removed, except for the portion denoted by numeral 44 (FIG. 4F), by way of anisotropic etching. The p-type impurity contained in the portion 44 is then electrically activated by heat treatments. Thus, an electrical conductor (also denoted by numeral 44) is formed within the trench 38. It is to be noted that the conductor 44 is electrically coupled to the substrate 20 which exhibits a low resistance as mentioned above.

Figure 4F:
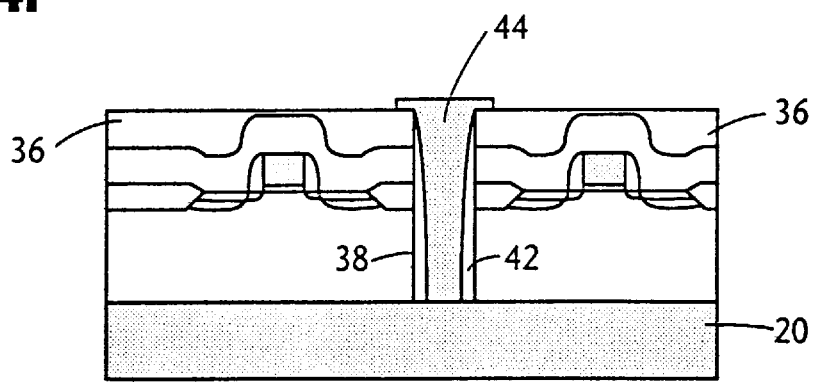
Figure 4G:
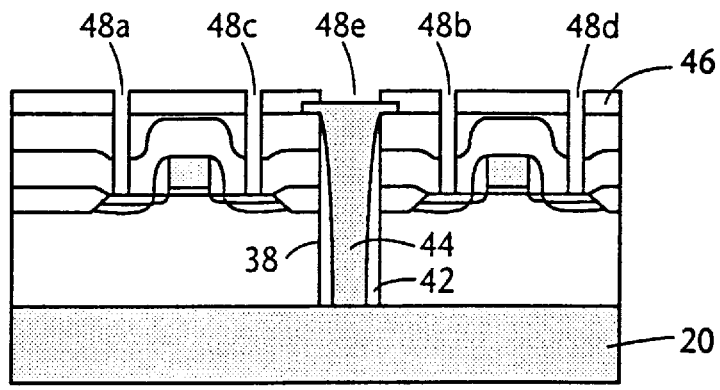
Figure 4H:
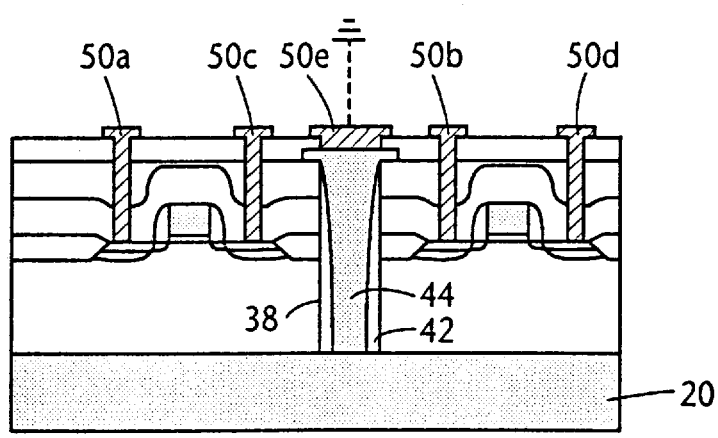

Subsequently, the entire top surface of the structure of FIG. 4F is covered with an inter-layer insulating film, after which a plurality of contact holes 48a–48d are formed in the layer 46 as shown in FIG. 4G. Thereafter, source electrodes 50a and 50b, drain electrodes 50c and 50d, and a guard ring electrode 50e are formed using a suitable metal such as aluminum, as shown in FIG. 4H. As shown by a phantom line in FIG. 4H, the guard ring electrode 50e is grounded. Thus, the IC according to the instant embodiment is fabricated.

The conductor 44 filled in the trench 38 is not limited to the p-type impurity implanted polycrystalline silicon. As an alternative, the conductor 44 is made of tungsten (for example). In this instance, after covering the inner wall of the trench 38 during the process shown in FIG. 4E, the entire top surface of the structure of FIG. 4E is covered with tungsten and then is anisotropically etched except for the interior of the trench 38. Thus, the tungsten is left within the trench 38 as the guard ring conductor 44. It is understood that when tungsten is utilized as the guard ring conductor 44, it is able to reduce the number of IC fabrication processes in that the heat treatments can be omitted. Further, the tungsten has a resistance lower than the polycrystalline silicon, it is preferable to use tungsten in view of effective transfer of the noises to ground.

Figure 5:
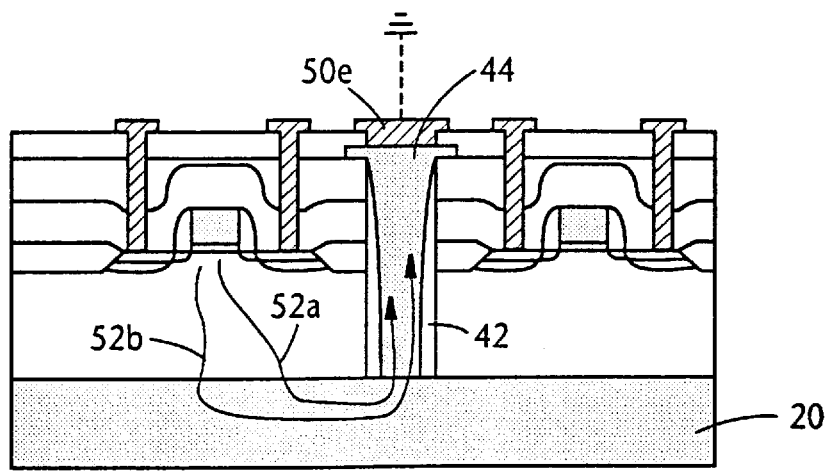
FIG. 5 is a sectional view of part of an integrated circuit, which is identical to FIG. 4H, presented for describing the operations of the present invention.

FIG. 5 is a diagram showing a simple example of how to prevent the noises generated in the digital circuit from being applied to the analog circuit according to the above mentioned embodiment. More specifically, the substrate noises reaching the substrate 20 are effectively guided to ground via the guard trench conductor as schematically shown by arrows 52a and 52b.

Figure 3A:
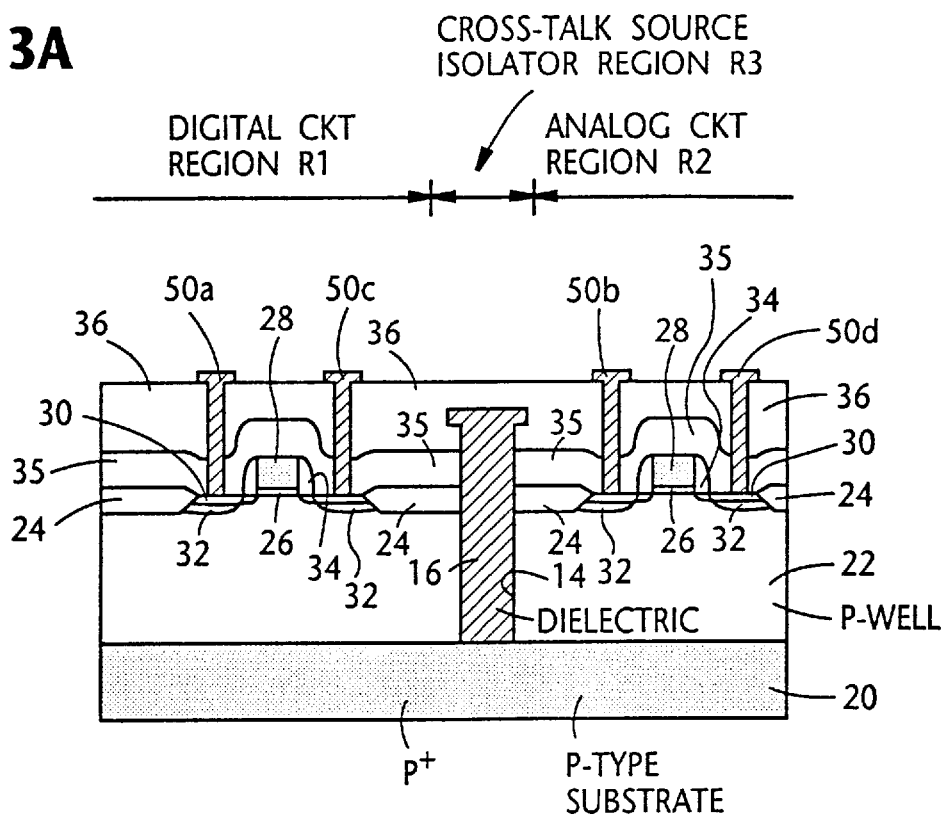
FIGS. 3A–3B are each a sectional view, taken along sectional line I—I of FIG. 1, of a second known technique.
Figure 3B:
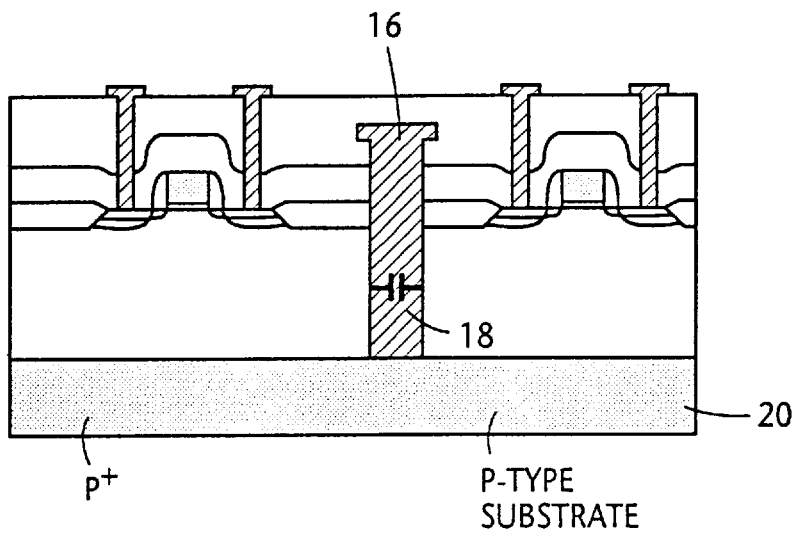
Figure 6:
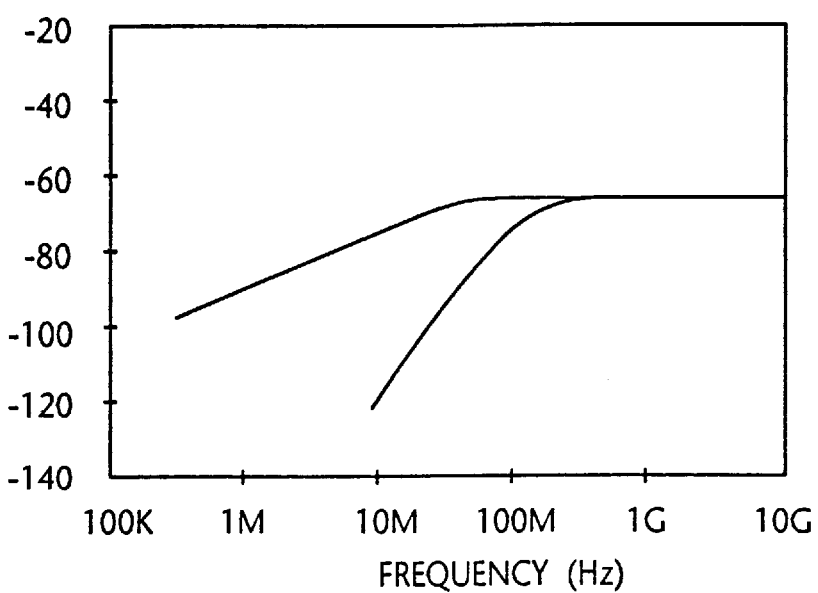
FIG. 6 is a graph showing the advantages of the present invention over one prior art technique.

The inventor conducted a computer simulation of the frequency dependency of the noise propagation gains of the above discussed embodiment and the prior art shown in FIGS. 3A and 3B. FIG. 6 is a graph showing the result of the computer simulation. It is understood from FIG. 6 that the instant embodiment is able to effectively reduce the cross-talk noise over 100 MHz.

In the above, the guard ring electrode 50e may be coupled, instead of ground, to a voltage source having a predetermine potential.

It will be understood that the above disclosure is representative of only one possible embodiment of the present invention and that the concept on which the invention is based is not specifically limited thereto.

What is claimed is:

1. An integrated circuit having an impurity diffused substrate of low resistance on which a silicon region is developed, comprising:
    a digital circuit formed on the silicon region;
    an analog circuit formed on the silicon region; and
    a trench formed in the silicon region, in a direction substantially normal to a major surface of the substrate, in a manner to separate said digital and analog circuits, said trench having a bottom portion reaching the substrate and having an inner wall covered with a dielectric material, said trench including therewithin an electrically conductive member which has a first end portion electrically connected to the substrate, wherein said conductive member is made of tungsten.

2. A method of fabricating a cross-talk source isolator in an integrated circuit, said integrated circuit having an impurity diffused substrate of low resistance on which a silicon region is developed, said integrated circuit including digital and analog circuits both formed on the silicon region, said method comprising the steps of:
    forming a trench in the silicon region, in a direction substantially normal to a major surface of the substrate, in a manner to separate said digital and analog circuits, said trench having a bottom portion reaching the substrate;
    covering an inner wall of said trench with a dielectric material; and
    forming an electrically conductive member by filling an electrically conductive material within said trench, said conductive member having a first end portion electrically coupled to the substrate, wherein said conductive member is made of tungsten.

* * * * *